(12) United States Patent
Lutze et al.

(10) Patent No.: US 7,504,686 B2
(45) Date of Patent: Mar. 17, 2009

(54) SELF-ALIGNED NON-VOLATILE MEMORY CELL

(75) Inventors: Jeffrey W. Lutze, San Jose, CA (US); Tuan Pham, San Jose, CA (US); Henry Chien, San Jose, CA (US); George Matamis, Nagoya (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/469,727

(22) Filed: Sep. 1, 2006

(65) Prior Publication Data
US 2007/0076485 A1 Apr. 5, 2007

Related U.S. Application Data

(62) Division of application No. 10/600,259, filed on Jun. 20, 2003, now Pat. No. 7,105,406.

(51) Int. Cl.
*H01L 29/76* (2006.01)
(52) U.S. Cl. ................ 257/314; 257/E29.129
(58) Field of Classification Search .......... 257/314, 257/315
See application file for complete search history.

(56) References Cited

U.S. PATENT DOCUMENTS

| | | | |
|---|---|---|---|
| 5,043,940 A | 8/1991 | Harari | 365/185.03 |
| 5,070,032 A | 12/1991 | Yuan et al. | 438/267 |
| 5,095,344 A | 3/1992 | Harari | 257/328 |
| 5,168,465 A | 12/1992 | Harari | 257/320 |
| 5,172,338 A | 12/1992 | Mehrotra et al. | 365/185.03 |
| 5,198,380 A | 3/1993 | Harari | 438/257 |
| 5,268,318 A | 12/1993 | Harari | 438/263 |
| 5,268,319 A | 12/1993 | Harari | 438/260 |
| 5,297,148 A | 3/1994 | Harari et al. | 714/710 |
| 5,313,421 A | 5/1994 | Guterman et al. | 365/185.15 |
| 5,315,541 A | 5/1994 | Harari et al. | 365/185.13 |
| 5,343,063 A | 8/1994 | Yuan et al. | 257/317 |
| 5,380,672 A | 1/1995 | Yuan et al. | 438/257 |
| 5,389,808 A | 2/1995 | Arai | 257/316 |

(Continued)

FOREIGN PATENT DOCUMENTS

DE 196 17 632 7/1997

OTHER PUBLICATIONS

Aritome, Seiichi, "Advanced Flash Memory Technology and Trends for File Storage Application," IEDM Technical Digest, International Electronic Devices Meeting, IEEE, San Francisco, California, Dec. 10-13, 2000, pp. 33.1.1-33.1.4.

(Continued)

*Primary Examiner*—Thao P. Le
(74) *Attorney, Agent, or Firm*—Vierra Magen Marcus & DeNiro LLP

(57) ABSTRACT

Floating gate structures are disclosed that have a projection that extends away from the surface of a substrate. This projection may provide the floating gate with increased surface area for coupling the floating gate and the control gate. In one embodiment, the word line extends downwards on each side of the floating gate to shield adjacent floating gates in the same string. In another embodiment, a process for fabricating floating gates with projections is disclosed. The projection may be formed so that it is self-aligned to the rest of the floating gate.

9 Claims, 9 Drawing Sheets

U.S. PATENT DOCUMENTS

| | | | | |
|---|---|---|---|---|
| 5,459,091 | A | 10/1995 | Hwang | 438/257 |
| 5,512,505 | A | 4/1996 | Yuan et al. | 438/264 |
| 5,534,456 | A | 7/1996 | Yuan et al. | 438/263 |
| 5,554,553 | A | 9/1996 | Harari | 438/264 |
| 5,579,259 | A | 11/1996 | Samachisa et al. | 365/185.14 |
| 5,595,924 | A | 1/1997 | Yuan et al. | 438/587 |
| 5,640,032 | A | 6/1997 | Tomioka | 257/316 |
| 5,654,217 | A | 8/1997 | Yuan et al. | 438/588 |
| 5,661,053 | A | 8/1997 | Yuan | 438/257 |
| 5,677,872 | A | 10/1997 | Samachisa et al. | 365/185.14 |
| 5,712,179 | A | 1/1998 | Yuan | 438/588 |
| 5,712,180 | A | 1/1998 | Guterman et al. | 438/263 |
| 5,747,359 | A | 5/1998 | Yuan et al. | 438/657 |
| 5,756,385 | A | 5/1998 | Yuan et al. | 438/258 |
| 5,786,988 | A | 7/1998 | Harari | 361/749 |
| 5,847,425 | A | 12/1998 | Yuan et al. | 257/315 |
| 5,867,429 | A | 2/1999 | Chen et al. | 365/185.3 |
| 5,883,409 | A | 3/1999 | Guterman et al. | 257/316 |
| 5,923,976 | A * | 7/1999 | Kim | 438/261 |
| 5,965,913 | A | 10/1999 | Yuan et al. | 257/321 |
| 5,981,335 | A | 11/1999 | Chi | 438/253 |
| 5,999,448 | A | 12/1999 | Kurihara et al. | 365/185.04 |
| 6,028,336 | A | 2/2000 | Yuan | 257/315 |
| 6,046,935 | A | 4/2000 | Takeuchi et al. | 365/185.03 |
| 6,060,360 | A | 5/2000 | Ln et al. | 438/264 |
| 6,103,573 | A | 8/2000 | Harari et al. | 438/257 |
| 6,151,248 | A | 11/2000 | Harari et al. | 365/185.14 |
| 6,208,545 | B1 | 3/2001 | Leedy | 365/51 |
| 6,222,762 | B1 | 4/2001 | Guterman et al. | 365/185.03 |
| 6,235,586 | B1 | 5/2001 | Au et al. | 438/258 |
| 6,258,665 | B1 | 7/2001 | Shimizu et al. | 438/257 |
| 6,281,075 | B1 | 8/2001 | Yuan et al. | 438/257 |
| 6,281,077 | B1 | 8/2001 | Patelmo et al. | 438/258 |
| 6,295,227 | B1 | 9/2001 | Sakui et al. | 365/185.17 |
| 6,297,097 | B1 | 10/2001 | Jeong | 438/264 |
| 6,417,538 | B1 | 7/2002 | Choi | 257/315 |
| 6,455,440 | B1 | 9/2002 | Jeng | 438/770 |
| 6,512,263 | B1 | 1/2003 | Yuan et al. | 257/316 |
| 6,529,410 | B1 | 3/2003 | Han et al. | 365/185.17 |
| 6,559,008 | B2 | 5/2003 | Rabkin et al. | 438/257 |
| 6,562,682 | B1 * | 5/2003 | Chiu et al. | 438/257 |
| 6,762,092 | B2 | 7/2004 | Yuan et al. | 438/257 |
| 7,105,406 | B2 | 9/2006 | Lutze et al. | 438/257 |
| 7,170,131 | B2 | 1/2007 | Yuan | 257/321 |
| 2001/0001491 | A1 | 5/2001 | Sakui | 257/316 |
| 2001/0015454 | A1 | 8/2001 | Lee et al. | 257/315 |
| 2002/0034849 | A1 * | 3/2002 | Wang et al. | 438/257 |
| 2002/0093073 | A1 | 7/2002 | Mori et al. | 257/510 |
| 2002/0160570 | A1 | 10/2002 | Tseng | 438/257 |
| 2004/0033663 | A1 | 2/2004 | Chuang et al. | 438/257 |
| 2004/0070021 | A1 * | 4/2004 | Yuan | 257/314 |
| 2004/0084713 | A1 * | 5/2004 | Hsieh | 257/315 |
| 2007/0122980 | A1 | 5/2007 | Yuan | 438/268 |

OTHER PUBLICATIONS

Takeuchi, Y., et al., "A Self-Aligned STI Process Integration for Low Cost and Highly Reliable 1Gbit Flash Memories," 1998 Symposium on VLSI Technology; Digest of Technical Papers, IEEE, Honolulu, Hawaii, Jun. 9-11, 1998, pp. 102-103.

Lee, Jae-Duk, et al., "Effects of Parasitic Capacitance on NAND Flash Memory Cell Operation," Non-Volatile Semiconductor Memory Workshop, IEEE, Monterey, California, Aug. 12-16, 2001, pp. 90-92.

Hori et al., "A MOSFET with Si-implanted Gate-SiO$_2$ Insulator for Nonvolatile Memory Applications," IEDM 92, Apr. 1992, pp. 469-472.

Chan, et al., "A True Single-Transistor Oxide-Nitride-Oxide EEPROM Device," *IEEE Electron Device Letters*, vol. EDL-8, No. 3, Mar. 1987, pp. 93-95.

Nozaki et al., "A 1-Mb EEPROM with MONOS Memory Cell for Semiconductor Disk Application," *IEEE Journal of Solid State Circuits*, vol. 26, No. 4, Apr. 1991, pp. 497-501.

Eitan et al., "NROM: A Novel Localized Trapping, 2-Bit Nonvolatile Memory Cell," *IEEE Electron Device Letters*, vol. 21, No. 11, Nov. 2000, pp. 543-545.

DiMaria et al., "Electrically-alterable read-only-memory using Si-rich SI0$_2$ injectors and a floating polycrystalline silicon storage layer," *J. Appl. Phys.* 52(7), Jul. 1981, pp. 4825-4842.

Patent Abstracts of Japan, Patent No. JP5190809, Published Jul. 1993, Kawasaki Steel Co., 1 pg.

Patent Abstracts of Japan, Patent No. JP2001 135736, Published May 2001, NEC Corp., 1 pg.

The International Bureau of WIPO, Notification Concerning Transmittal of International Preliminary Report on Patentability (including Written Opinion) mailed on Jan. 12, 2006 in corresponding International Application No. PCT/US2004/018545, 10 pgs.

European Patent Office, First Examiner's Report mailed in Jun. 14, 2006 in corresponding European Application No. 04 776 457.6, 2 pgs.

"Notification of Transmittal of the International Search Report, or the Declaration", corresponding PCT application No. PCT/US2004/018545, International Searching Authority, European Patent Office, Nov. 22, 2004, 16 pgs.

Taiwan Patent Office, Preliminary Notice of Rejection of the IPO issued in corresponding Taiwan application, dated Jun. 21, 2005, 3 pgs (translation attached).

USPTO, Notice of Allowance mailed on Apr. 26, 2006 in U.S. Appl. No. 10/600,259, 10 pgs.

USPTO, Office Action mailed on Oct. 5, 2005 in U.S. Appl. No. 10/600,259, 9 pages.

USPTO, Notice of Allowance mailed on May 27, 2005 in U.S. Appl. No. 10/600,259, 8 pgs.

USPTO, Office Action mailed on Feb. 1, 2005 in U.S. Appl. No. 10/600,259, 11 pgs.

USPTO, Office Action mailed on Aug. 30, 2004 in U.S. Appl. No. 10/600,259, 11 pgs.

USPTO, Notice of Allowance mailed on Apr. 29, 2004 in U.S. Appl. No. 10/600,259, 10 pgs.

Chinese Office Action dated Jul. 25, 2008 in Chinese Patent Application No. 200480020878.6.

* cited by examiner

SELF-ALIGNED NON-VOLATILE MEMORY CELL

CROSS-REFERENCE TO RELATED APPLICATION

This application is a divisional of application Ser. No. 10/600,259, filed Jun. 20, 2003, now U.S. Pat. No. 7,105,406, which application is incorporated in its entirety by reference as if fully set forth herein.

FIELD OF THE INVENTION

This invention relates generally to non-volatile flash memory systems, and, more specifically, to the structures of memory cells and arrays of memory cells, and to the process of forming them.

BACKGROUND OF THE INVENTION

There are many commercially successful non-volatile memory products being used today, particularly in the form of small form factor cards, which use an array of flash EEPROM (Electrically Erasable and Programmable Read Only Memory) cells. In one type of architecture, a NAND array, wherein series strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. An example of a NAND architecture array and its operation as part of a memory system is found in U.S. Pat. No. 6,046,935, which patent is incorporated herein in its entirety by this reference.

In another type of array having a "split-channel" between source and drain diffusions, the floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, 5,661,053, and 6,281,075, which patents are incorporated herein by this reference.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762, which patents incorporated herein by this reference.

In either of the two types of memory cell arrays described above, the floating gate of a cell is programmed by injecting electrons from the substrate to the floating gate. This is accomplished by having the proper doping in the channel region and applying the proper voltages to the source, drain and remaining gate(s). So-called "source side" injection is preferred, which is also described in the foregoing U.S. Pat. No. 5,313,421.

Two techniques for removing charge from floating gates to erase memory cells are used in both of the two types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making a compromise because of the two functions. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sectors' worth of data. Multi-block erasure, defect management and other flash EEPROM system features are described in U.S. Pat. No. 5,297,148, which patent is incorporated herein by this reference.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Another flash EEPROM architecture utilizes a dual floating gate memory cell along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. Examples of this cell array architecture and operating techniques are described in U.S. Pat. Nos. 5,712,180, 6,103,573 and 6,151,248, which patents are expressly incorporated herein in their entirety by this reference.

In these and other types of non-volatile memories, the amount of field coupling between the floating gates and the control gates passing over them is carefully controlled. The amount of coupling determines the percentage of a voltage placed on the control gate that is coupled to its floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described by Yuan et al in U.S. Pat. No. 5,343,063, which patent is incorporated herein in its entirety by this reference. The approach described in that patent is to make the floating gates thicker than usual to provide large vertical surfaces that may be coupled with the control gates. The approach described in that patent application is to increase coupling between the floating and control gates by adding a vertical projection to the floating gate.

When increasing the vertical coupling areas between adjacent floating and control gates, it is further desirable to do so in a manner that does not increase the area of the substrate that is occupied by each cell.

SUMMARY OF THE INVENTION

The present invention includes a floating gate structure that has improved characteristics. In particular, a floating gate is disclosed that has an increased surface area for coupling the floating gate to the control gate. The increased area may be achieved by constructing the floating gate from two portions. A related approach is described in pending application Ser. No. 10/268,635, filed on Oct. 9, 2002 by Jack H. Yuan, which patent application is incorporated herein in its entirety by this reference. The first floating gate portion is similar to the floating gate structures of the prior art. The second floating gate portion extents from the upper surface of the first floating gate portion. The second floating gate portion may extend to the edges of the first floating gate portion in the word line direction but is narrower than the first floating gate portion in the direction perpendicular to the word line direction. This allows the control gate to wrap around the floating gate and shield the floating gate in the direction perpendicular to the word line direction.

Another embodiment includes a self-aligned process for making an improved floating gate structure. In this process a layer of material, such as silicon dioxide, is used to cover the substrate with openings in the layer over the first floating gate portions. The openings are self-aligned to the first gate portions. These openings are then used to establish the position of the second gate portions in a process that does not require alignment. The openings are narrowed by forming side-wall spacers. The second floating gate portions are then formed in the narrow openings.

Additional aspects, advantages and features of the present invention are included in the following description of these detailed examples, which description should be taken in conjunction with the accompanying drawings.

DESCRIPTION OF EXEMPLARY EMBODIMENTS

Figure 1:
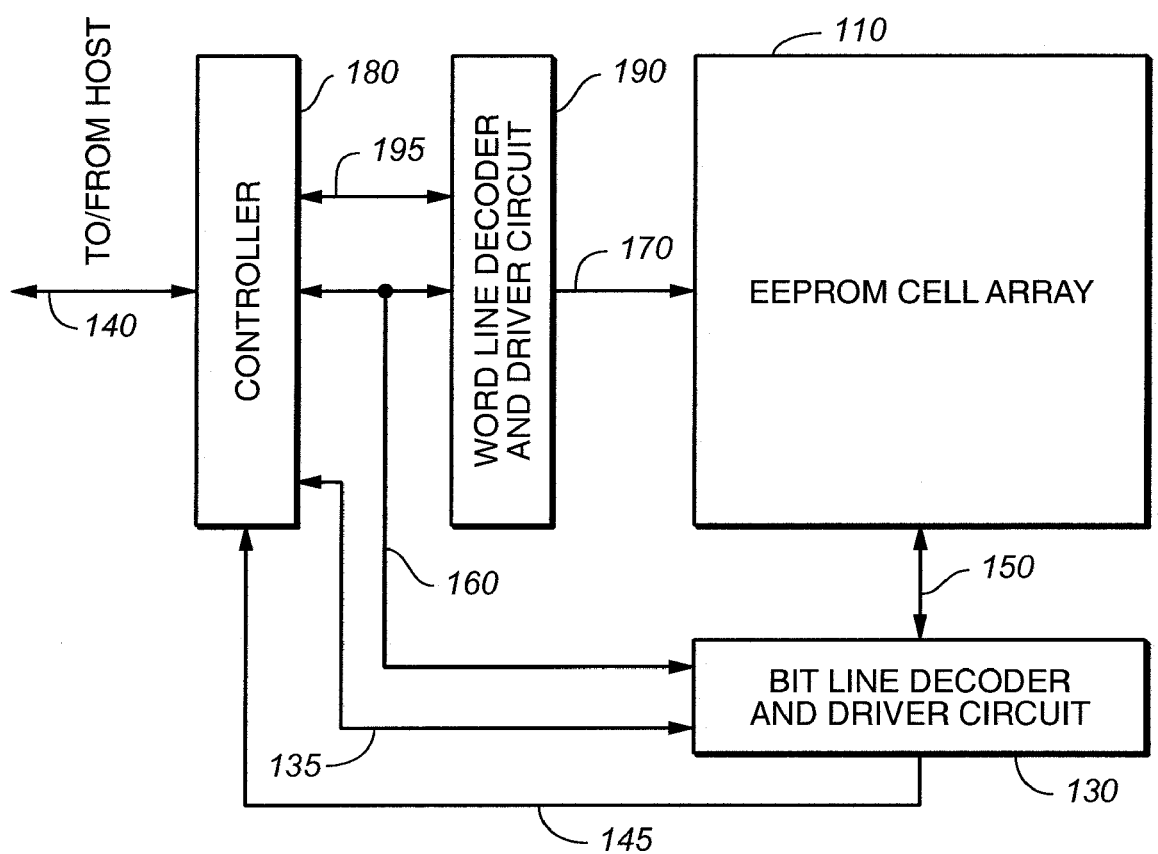
FIG. 1 illustrates in block diagram form a flash EEPROM system in which the various aspects of the present invention may be implemented.

An example of a memory system incorporating the various aspects of the present invention is generally illustrated in the block diagram of FIG. 1. A large number of individually addressable memory cells are arranged in a regular array 110 of rows and columns, although other physical arrangements of cells are certainly possible. Bit lines, designated herein to extend along columns of the array 110 of cells, are electrically connected with a bit line decoder and driver circuit 130 through lines 150. Word lines, which are designated in this description to extend along rows of the array 110 of cells, are electrically connected through lines 170 to a word line decoder and driver circuit 190. Each of the decoders 130 and 190 receives memory cell addresses over a bus 160 from a memory controller 180. The decoder and driving circuits are also connected to the controller 180 over respective control and status signal lines 135 and 195.

The controller 180 is connectable through lines 140 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the CompactFlash™ Association, the MMC™ Association, and others. When in a card format, the lines 140 terminate in a connector on the card that interfaces with a complementary connector of the host device. The electrical interface of many cards follows the ATA standard, wherein the memory system appears to the host as if it was a magnetic disk drive. Other memory card interface standards also exist. As an alternative to the card format, a memory system of the type shown in FIG. 1 may be permanently embedded in the host device.

The decoder and driver circuits 130 and 190 generate appropriate voltages in their respective lines of the array 110, as addressed over the bus 160, according to control signals in respective control and status lines 135 and 195, to execute programming, reading and erasing functions. Any status signals, including voltage levels and other array parameters, are provided by the array 110 to the controller 180 over the same control and status lines 135 and 195. A plurality of sense amplifiers within the circuit 130 receive current or voltage levels that are indicative of the states of addressed memory cells within the array 110, and provides the controller 180 with information about those states over lines 145 during a read operation. A large number of sense amplifiers are usually used in order to be able to read the states of a large number of memory cells in parallel. During reading and program operations, one row of cells is typically addressed at a time through the circuits 190 for accessing a number of cells in the addressed row that are selected by the circuit 130. During an erase operation, all cells in each of many rows are typically addressed together as a block for simultaneous erasure.

Figure 2A:
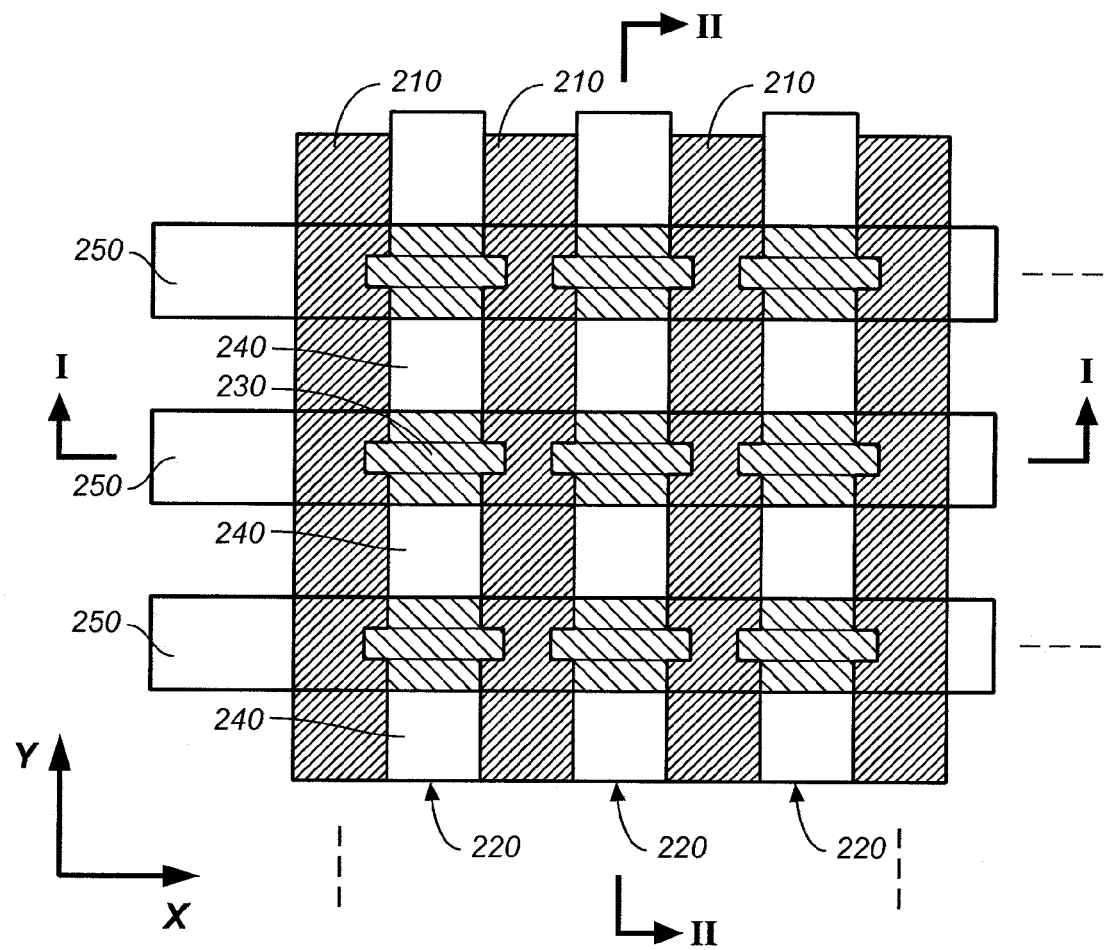
FIG. 2(A) is a plan view of a floating gate memory cell array that utilizes the present invention.

A plan view of an example of a NAND memory cell array 110 formed on a silicon substrate is shown in FIG. 2(A), wherein a small part of its repetitive structure of conductive elements is illustrated with little detail of dielectric layers that exist between the elements, for clarity of explanation. Shallow Trench Isolation (STI) regions 210 are formed extending through the surface of the substrate. In order to provide a convention for this description, the STI regions are shown to be spaced apart in a first x-direction, with lengths extending in a second y-direction, these first and second directions being essentially orthogonal with each other.

Between the STI regions 210, there are strings 220 of memory cells running in the y-direction. Thus, the direction of the strings is parallel to the direction of the STI regions. Each string 220 includes many memory devices connected in series. FIG. 2(A) shows portions of three such strings 220 with three memory cells shown for each string. However, strings 220 contain additional cells that are not shown in FIG. 2(A). Also, the array 110 contains additional strings that are not represented in FIG. 2(A). This type of array may have thousands of strings with 16, 32 or more cells in each string.

Each memory cell includes a floating gate 230 and conductive source/drain regions 240 in the substrate adjacent to the floating gate, on either side in the y-direction. Strings are separated by STI regions 210. These STI regions 210 form isolating elements that electrically isolate source/drain regions 240 from source/drain regions 240 of cells in adjacent strings. Along the y-direction source/drain regions 240 are shared by adjacent cells. The source/drain regions 240 electrically connect one cell to the next cell thus forming a string of cells. The source/drain regions 240 in this example are formed by implanting impurities into the substrate in the required areas.

Figure 2B:
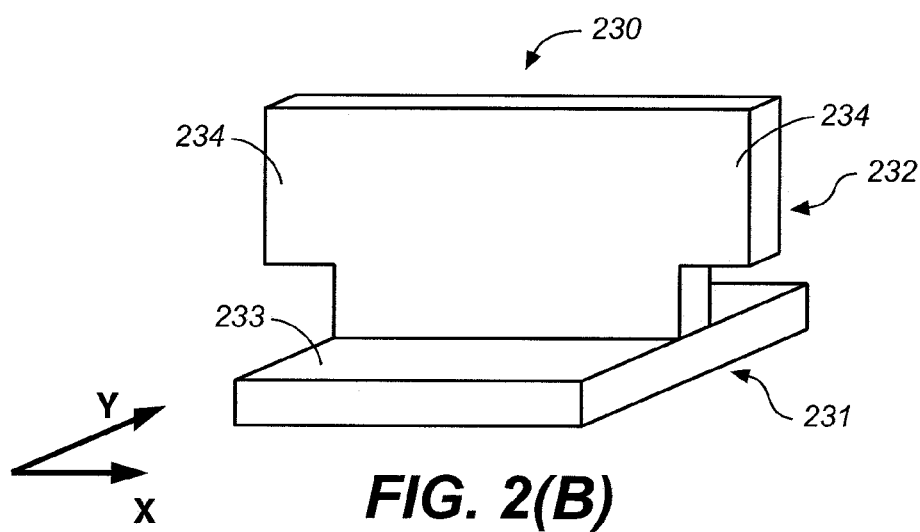
FIG. 2(B) illustrates a floating gate of the array of FIG. 2(A).

The floating gates 230 shown in the embodiment of FIG. 2(A) comprise two portions that can be better seen in FIG. 2(B). A first floating gate portion 231 is formed from a sheet of polysilicon that extends across the surface of the substrate on a thin silicon dioxide (oxide) layer. A first floating gate portion 231 is similar to a conventional floating gate. The second floating gate portion 232 projects upward from the upper surface 233 of the first floating gate portion 231. In the example shown in FIG. 2(B) the second floating gate portion 232 is a sheet of material that intersects the first floating gate portion 231 at right angles. The second floating gate portion 232 extends to the edges of the first floating gate portion 231 in the x-direction but is much narrower in the y-direction. Thus, it leaves some of the upper surface 233 of the first floating gate portion 231 exposed. In the example shown the second floating gate portion 232 has wing portions 234 that extend on either side in the y-direction. These wing portions 234 extend over the STI regions 210 in this embodiment. These wing portions 234 are not essential to the invention but do serve to increase the surface area of the floating gate 230 that is coupled with the word line later formed over and around them. In addition, the extension of the floating gate 230 over the STI region allows for some misalignment between the etching process that separates adjacent floating gates in the x-direction and the STI region 210.

The first and second floating gate portions 231, 232 of this embodiment are both made of doped polysilicon. Polysilicon could also be deposited in an undoped form and later implanted to form doped polysilicon. Other suitable electrically conductive materials may also be used in place of doped polysilicon.

Word lines 250 are shown extending across the array in the x-direction in FIG. 2(A). The word lines 250 overlie portions of the floating gates 230 and also partially surround the floating gates 230. In the embodiment shown, the word lines 250 overlie the exposed parts of the upper surface 233 of the first floating gate portion 231 and enclose the upper surface and the sides of the second floating gate portion 232. The second floating gate portion 232 adds to the surface area of the floating gate that couples the floating gate 230 and the control gate. This increased area provides an improved coupling ratio compared to a conventional floating gate. For example, a floating gate 230 of this embodiment having a first floating gate portion having dimension D in the x and y-directions may give a 25% increase in the area of coupling between the floating gate 230 and the control gate compared to a conventional gate with dimension D in the x and y-directions. This 25% increase in area has been found to result in an 8% increase in coupling ratio between the control gate and the floating gate. The dimension D of the floating gate 230 is generally the minimum feature size for the photolithographic process being used. However, this is not essential. It will be understood that reduced size is generally desirable in devices of this kind but the invention is not limited to any particular size.

Not shown in FIG. 2(A) are metal conductor layers. Since the polysilicon elements usually have a conductivity that is significantly less than that of metal, metal conductors are included in separate layers with connections made to respective metal lines through any intermediate layers at periodical intervals along the lengths of the polysilicon elements. Also, the word line may include a metal or metal-silicide portion to increase the electrical conductivity of the word line. For example, a refractory metal such as Cobalt or Tungsten may be used to form a silicide layer on top of the polysilicon layer. The silicide material has a higher conductivity than the polysilicon and thus improves electrical conduction along the word line.

Figure 3A:
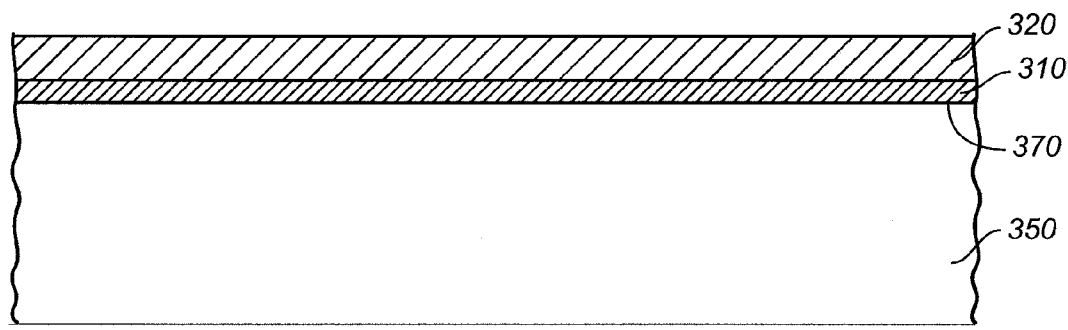
FIG. 3(A) shows a cross-section of the array of FIG. 2(A) along II-II at an intermediate stage of fabrication after polysilicon deposition.
Figure 3B:
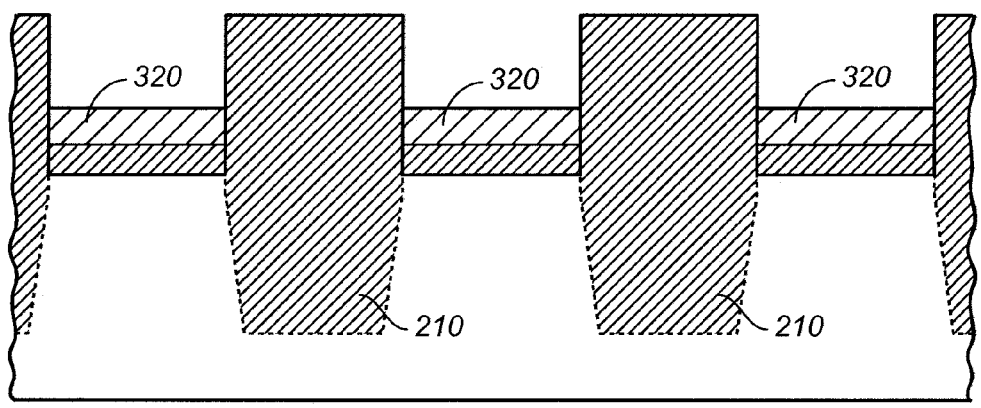
FIG. 3(B) shows a cross-section of the array of FIG. 2(A) along I-I at the same stage of fabrication as 3(A).

FIGS. 3(A) and 3(B) show two orthogonal cross-sections of the array of FIG. 2(A) at an intermediate state of array fabrication. FIG. 3(A) shows the view in the y-direction of FIG. 2(A) taken along a section II-II. FIG. 3(B) shows the view in the x-direction, indicated in FIG. 2(A) taken along a section I-I. In FIG. 3(B), the STI regions 210 have been formed and strips of gate dielectric 310 and polysilicon 320 have been formed between them. These polysilicon strips 320 are later formed into individual floating gate portions. FIG. 3(A) shows a cross-section along one such strip 320. FIG. 3(B) gives a view of the same structure at the same stage fabrication but along a perpendicular direction to that of FIG. 3(A). Three polysilicon strips 320 and the STI regions 210 between them are visible in FIG. 3(B). A typical polysilicon thickness for such a structure is about 400 Angstroms. The STI typically extends about 400 Angstroms above the upper surface of the polysilicon strips 320 and the STI may extend 2000 Angstroms below the surface 370 of the substrate to provide isolation between strings of memory cells.

Figure 4A:
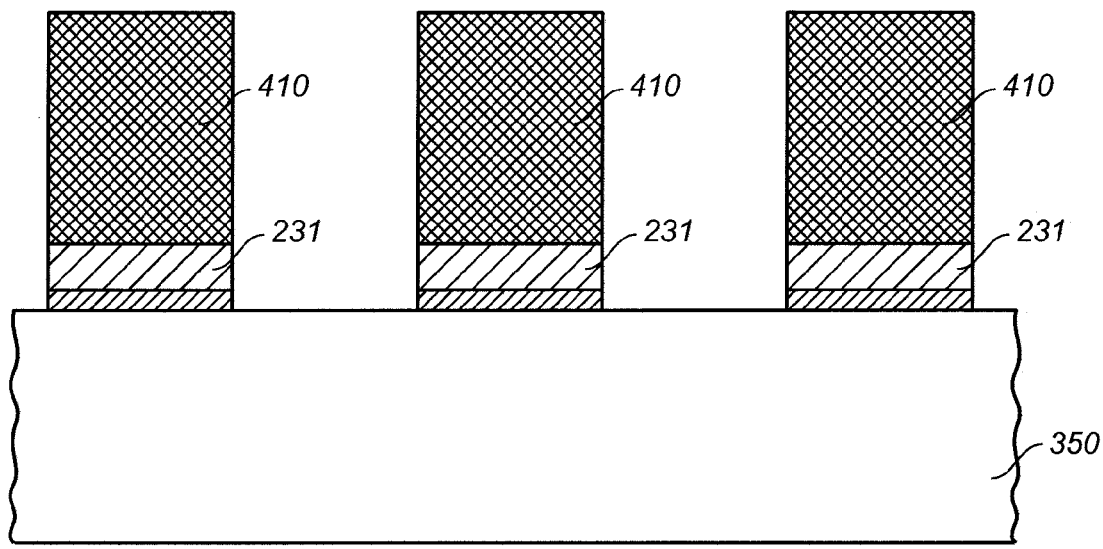
FIG. 4(A) shows the same view as in FIG. 3(A) after deposition and etch of silicon nitride.
Figure 4B:
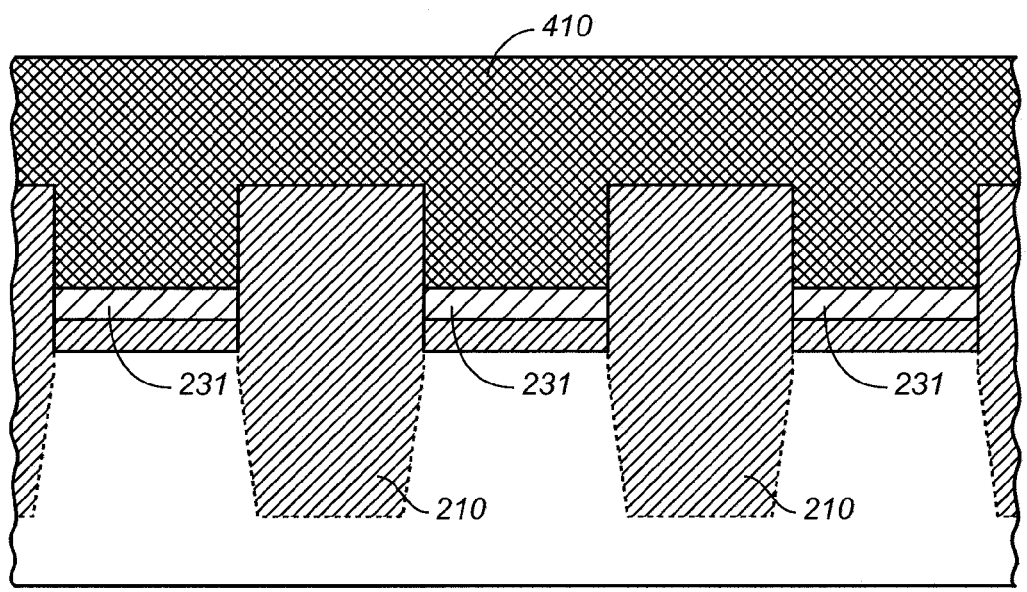
FIG. 4(B) shows the same view as in FIG. 3(B) after deposition and etch of silicon nitride.

FIGS. 4(A) and 4(B) show the same views as respective FIGS. 3(A) and 3(B) after deposition of a masking material, in this example silicon nitride (nitride), followed by patterning and etching steps. The first view of FIG. 4(A) shows the separate silicon nitride portions 410 formed by this step. Also shown are the individual polysilicon first floating gate portions 231 formed by the patterning and etching process. Polysilicon and silicon nitride are etched in the same pattern so that each first polysilicon floating gate portion 231 has a silicon nitride portion 410 covering it. The silicon nitride portions 410 are strips that extend across the substrate in the x-direction. These silicon nitride strips 410 act as dummy word lines as they are in place of the word lines but are later removed. The polysilicon strips 320 that extended in the y-direction in FIG. 3(A) have been etched in FIG. 4(A) so that only the first floating gate portions 231 covered by the silicon nitride portions 410 remain. The silicon nitride portions 410 serve as a mask layer for the subsequent implantation step.

During implantation, the source/drain regions 240 are created by implanting impurities into the substrate 350 in the exposed areas. In this example, the only areas that are exposed are the areas between the STI regions 210 that are not covered by the first polysilicon portions 231 and silicon nitride portions 410. Different impurities may be implanted depending on the electrical characteristics required. For example, Arsenic ions may be used to create a region that is doped to be n+.

After the source/drain regions 240 are implanted, silicon dioxide is deposited over the surface of the substrate, filling the areas between the silicon nitride portions 410 and covering over the silicon nitride portions 410. The excess silicon dioxide that is deposited over the silicon nitride portions 410 is removed. For example, the excess silicon dioxide may be etched by a silicon dioxide spacer etch that stops on the silicon nitride. Alternatively, the excess silicon dioxide may be removed by Chemical Mechanical Polishing (CMP). The result of either etching or CMP is a substantially planar surface. Silicon dioxide and silicon nitride portions are both exposed at this surface. The silicon nitride portions are then removed using, for example, a phosphoric acid (H3PO4) strip. This leaves the structure shown in FIG. 5(A).

Figure 5A:
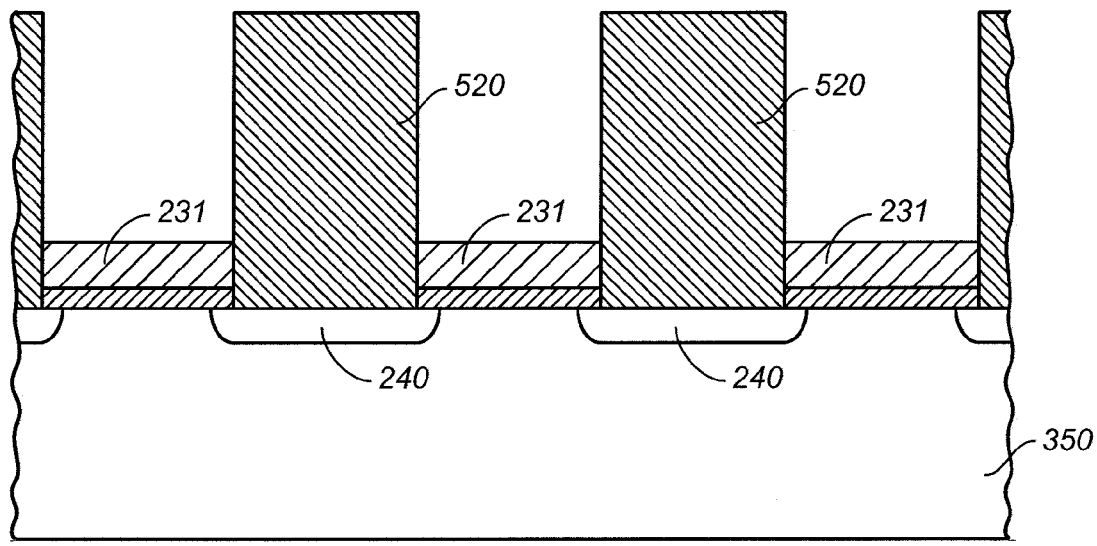
FIG. 5(A) shows the same view as in FIG. 4(A) after deposition of silicon dioxide and removal of silicon nitride.
Figure 5B:
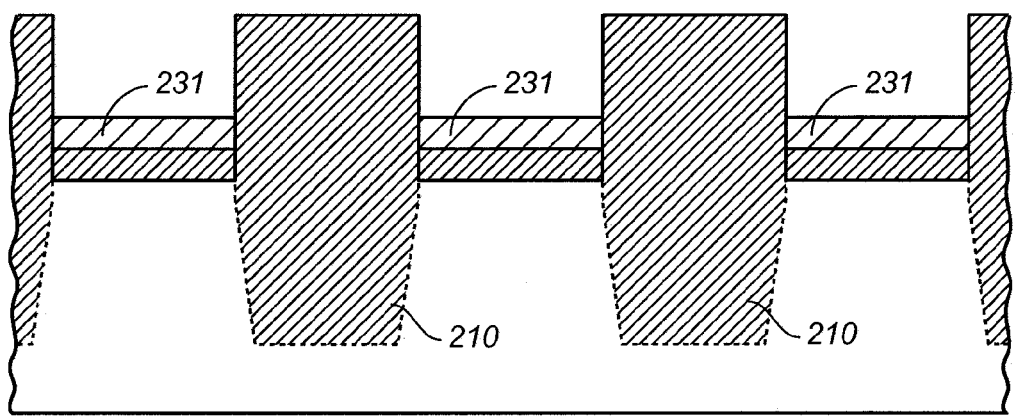
FIG. 5(B) shows the same view as in FIG. 4(B) after deposition of silicon dioxide and removal of silicon nitride.

FIGS. 5(A) and 5(B) show the same views as previous figures after the implantation step, deposition of silicon dioxide and removal of silicon nitride. The implanted regions 240 extend between floating gates 231 in the y-direction. In the x-direction, they extend to the STI regions. The silicon dioxide forms a patterned layer comprising silicon dioxide portions 520, leaving the polysilicon first floating gate portions 231 exposed. The silicon dioxide portions 520 form trenches between them with the exposed polysilicon first floating gate portions 231 at the bottom of the trenches. The silicon dioxide patterned layer thus formed is self-aligned to the polysilicon first floating gate portions 231 because the openings in the patterned layer are determined by the position of polysilicon portions 231.

Figure 6A:
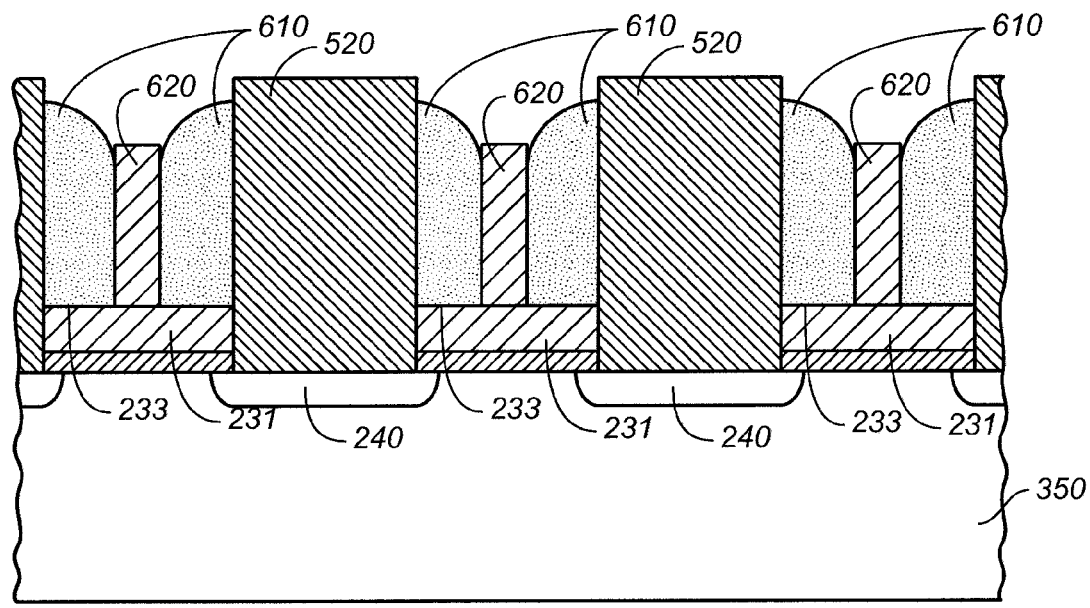
FIG. 6(A) shows the same view as in FIG. 5(A) after formation of nitride spacers and second polysilicon floating gate elements.
Figure 6B:
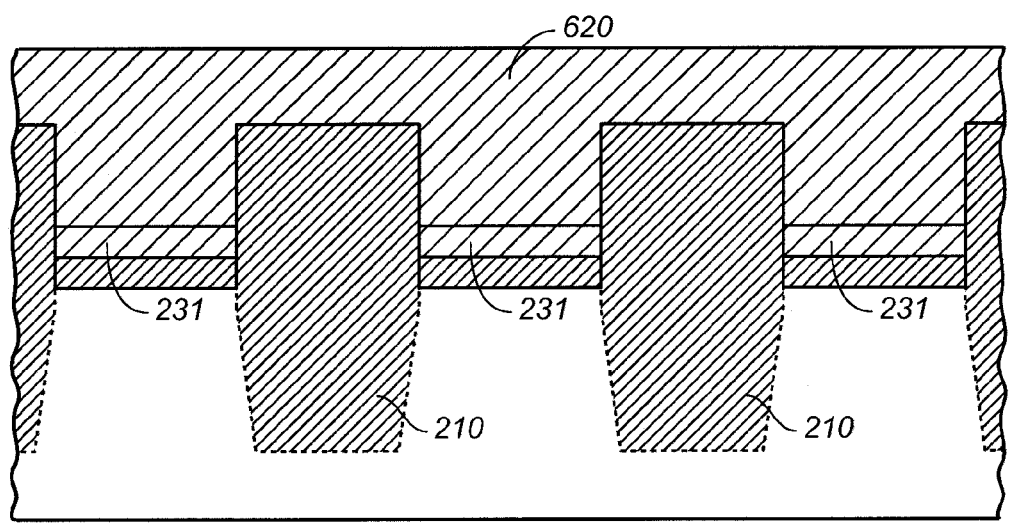
FIG. 6(B) shows the same view as in FIG. 5(B) after formation of nitride spacers and second polysilicon floating gate elements.

FIGS. 6(A) and 6(B) show the same views as before after a silicon nitride spacer layer has been deposited and etched back to form the spacers 610 shown on the sides of the silicon dioxide portions 520. For example, 500 Angstroms of silicon nitride could be deposited and then a silicon nitride spacer etch could be performed to form an opening in the silicon nitride that exposes the first floating gate portions 231. The spacers 610 reduce the opening between adjacent silicon dioxide portions 520 to a much narrower gap between spacers 610. This gap extends upwards from the upper surface 233 of the first floating gate portion 231. Polysilicon is deposited to fill this gap and create a polysilicon element 620 that is physically and electrically continuous with the first polysilicon floating gate portions 231. For example, 500 Angstroms of polysilicon may be deposited to fill the gap between spacers 610 and create the polysilicon element 620. Polysilicon is typically deposited to a height greater than that needed to create the polysilicon element 620 and then is etched back to the appropriate height. This etch-back process removes excess polysilicon. Thus, after polysilicon deposition, the polysilicon is etched to produce the structure shown in FIG. 6(B). At this point in the process, the polysilicon elements 620 extend in the x-direction forming continuous strips running across strings of cells.

Figure 7A:
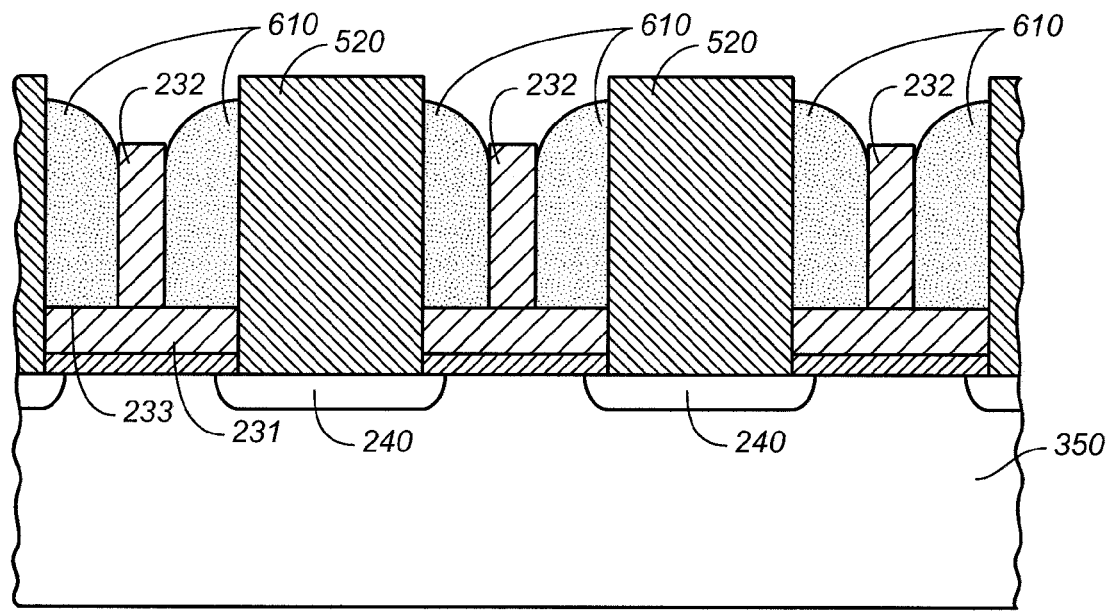
FIG. 7(A) shows the same view as in FIG. 6(A) after separation of adjacent floating gates in the word line direction.
Figure 7B:
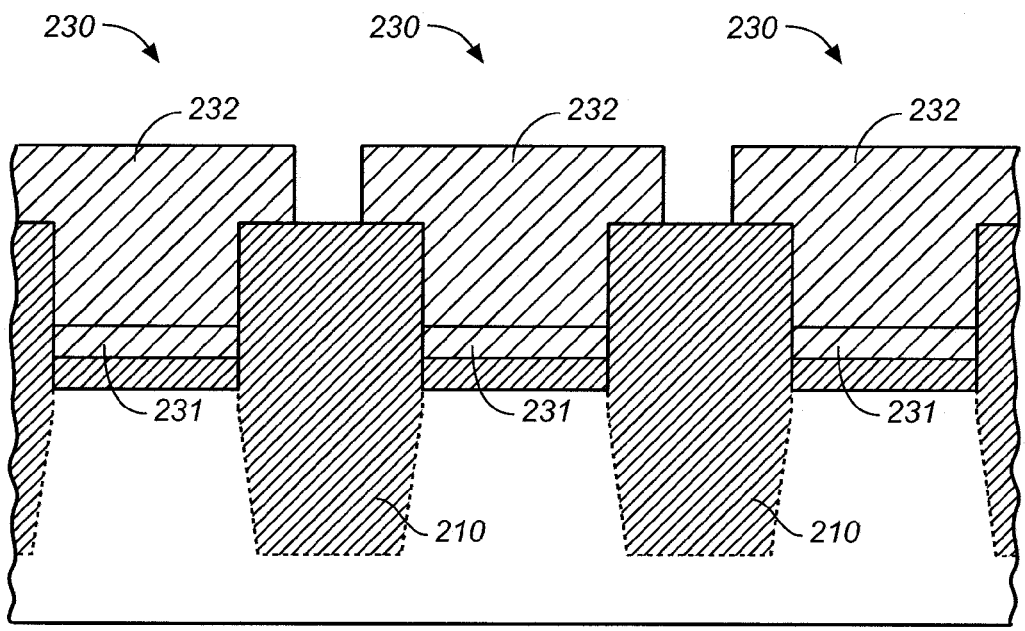
FIG. 7(B) shows the same view as in FIG. 6(B) after separation of adjacent floating gates in the word line direction.

FIGS. 7(A) and 7(B) show the same views as before after the polysilicon elements 620 are etched to form second floating gate portions 232 for each cell. Thus, separate floating gates 230 are formed for each cell. This is referred to as a "slit etch." Etching is performed in a pattern determined by a photolithographic step requiring alignment of the required etch pattern with the existing structure. In the example shown, the gap formed between individual floating gates 230 is narrower than the width of the STI region 210 over which it lies. This allows for some error in the alignment of the etching pattern with the pattern of STI regions 210.

Figure 8A:
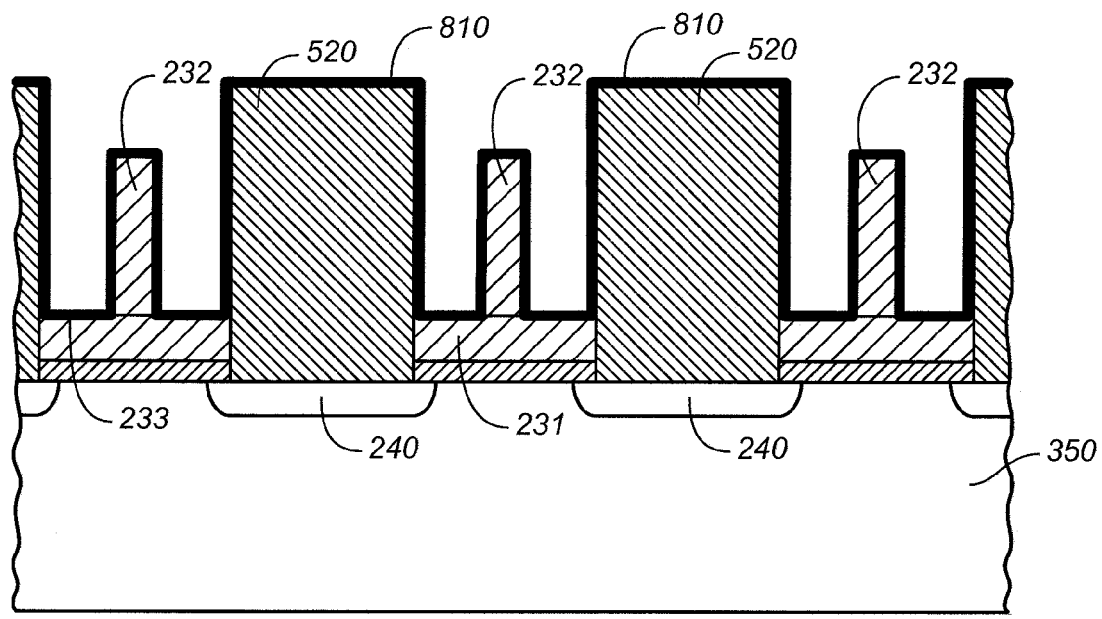
FIG. 8(A) shows the same view as in FIG. 7(A) after deposition of interpoly dielectric
Figure 8B:
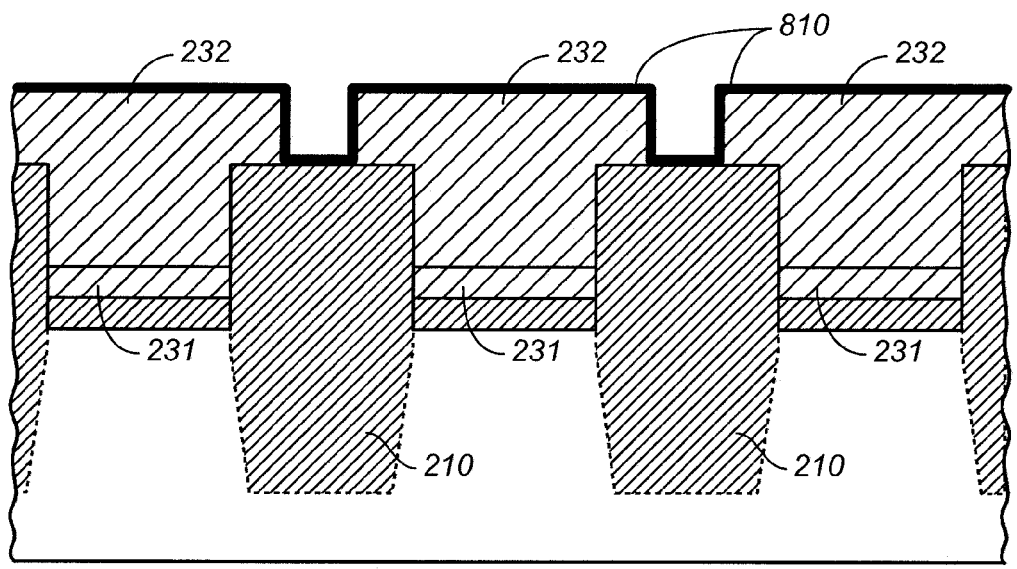
FIG. 8(B) shows the same view as in FIG. 7(B) after deposition of interpoly dielectric

FIGS. 8(A) and 8(B) show the same views as before after the silicon nitride spacers 610 have been removed and a dielectric layer 810 has been deposited. The silicon nitride strip may be performed using $H_3PO_4$. Removing the silicon nitride spacers 610 leaves the second polysilicon portions 232 exposed on the sides opposite to the silicon dioxide structures 520 and also exposes the upper surfaces 233 of the first polysilicon portions 231. A dielectric layer 810 is deposited to cover all the exposed surfaces of the polysilicon portions. In this example, an ONO layer was deposited. Such a layer may be comprised of about 50 Angstroms of silicon dioxide, followed by about 80 Angstroms of Silicon nitride, followed by about 50 Angstroms of Silicon dioxide.

Figure 9A:
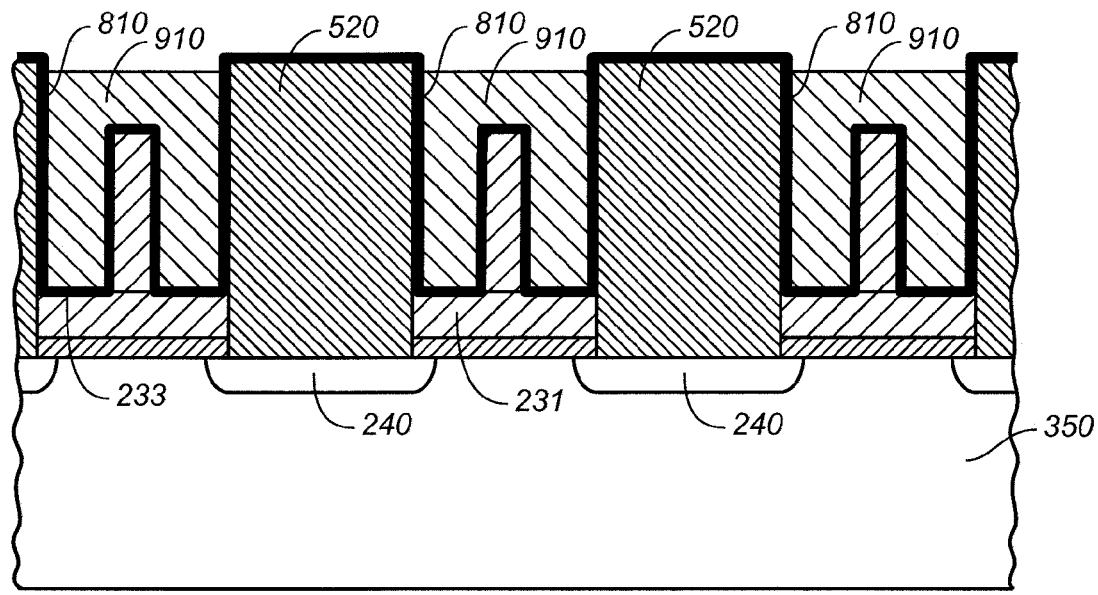
FIG. 9(A) shows the same view as in FIG. 8(A) after deposition of a polysilicon control gate layer.
Figure 9B:
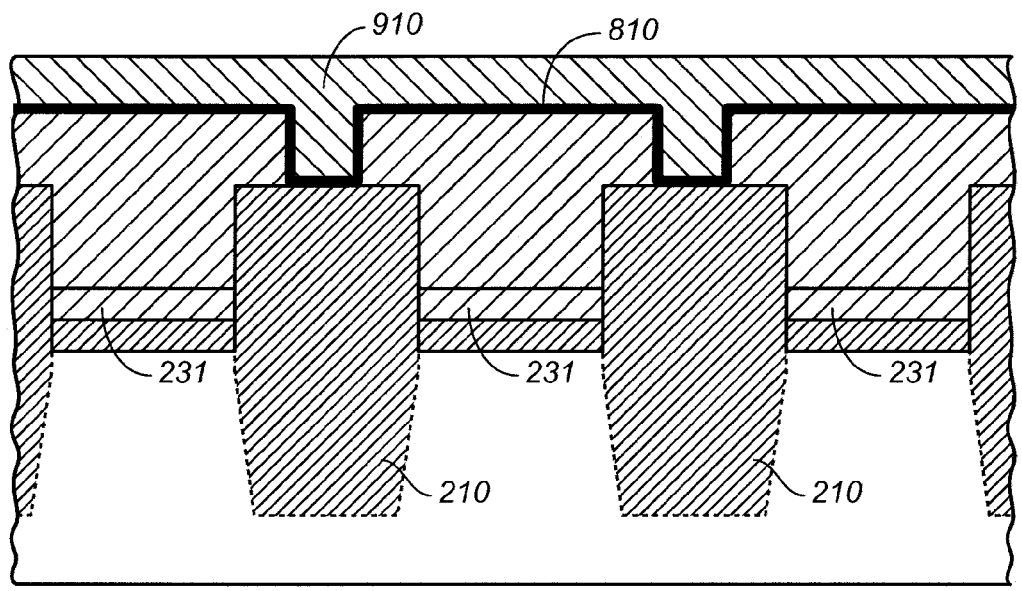
FIG. 9(B) shows the same view as in FIG. 8(B) after deposition of a polysilicon control gate layer.

FIGS. 9(A) and 9(B) shows the same views as before after control gates are formed. Control gates are conductive gates formed of doped polysilicon 910 in this example. Approximately 1500 Angstroms of polysilicon is deposited to fill the trenches between silicon dioxide portions 520. The polysilicon may be etched back or subjected to CMP to remove excess polysilicon. The etch or CMP step removes polysilicon that overlies the silicon dioxide portions 520 and stops upon reaching the silicon dioxide portions 520. The polysilicon 910 surrounds the second polysilicon floating gate portions 232 from all four sides and from above. Polysilicon 910 forms a conductive gate over each floating gate. The conductive gate may be used as a control gate for programming and reading the floating gate. Polysilicon 910 forms word lines that extend across the substrate. Control gates of memory cells in a row are connected together by the polysilicon word line.

The dielectric layer 810 separates the control gate polysilicon 910 and the floating gates 230. Because it lies between these two polysilicon layers it is often referred to as "interpoly dielectric." The dielectric layer 810 isolates the control gates and floating gates from direct electrical connection but allows them to be electrically coupled. Each floating gate 230 is electrically isolated from the substrate by means of a gate dielectric layer 310, typically silicon dioxide. This electrical isolation allows the floating gate 230 to act as a charge storage unit. The thin gate dielectric layer 310 allows charge to enter the floating gate 230 under certain conditions. The presence of charge in the floating gate 230 may be detected by its effect on current flowing between the source/drain regions 240. Levels of charge in the floating gate may correspond to logic levels and thus data may be stored in the cell.

If needed, the word line may be made more conductive by adding a metal or a metal-silicide layer on the polysilicon. This may be done by depositing a refractory metal then annealing to form a silicide. For example, Cobalt (Co) may be deposited on Silicon and then annealed to form Cobalt Silicide ($CoSi_2$). A silicide layer may also be formed by Chemical Vapor Deposition (CVD). For example CVD of Tungsten Silicide ($WSi_2$) may be performed.

The above description details particular embodiments of the invention and describes embodiments of the invention using particular array architecture. However, the invention is not limited to the embodiments disclosed or to the particular architecture used in the examples given. It will be understood that the invention is entitled to protection within the full scope of the appended claims.

The invention claimed is:

1. A non-volatile memory cell array of conductive floating gates arranged in strings, each of the strings extends in a first direction, each string comprising at least four floating gates electrically connected in series by source/drain regions, the source/drain regions associated with a first of the strings electrically connect one floating gate to a next floating gate to form the first string, the source/drain regions of a given string are separated from the source/drain regions of adjacent strings by isolating elements, the floating gates individually comprise a first floating gate portion that has an upper surface and a lower surface both upper and lower surfaces being parallel to a surface of a substrate and a second floating gate portion that extends upward from a first region of the upper surface of the first floating gate portion, the second floating gate portion extends from the upper surface of the first floating gate portion such that a cross-section of the floating gate that is parallel to the first direction forms an inverted T shape.

2. The memory cell array of claim 1 wherein the second floating gate portion extends from one isolating element to an adjacent isolating element at the upper surface of the first floating gate portion and extends over the first isolating element and the second isolating element at a level above the surface of the first floating gate portion.

3. The non-volatile memory cell array of claim 1 wherein the second floating gate portion is self-aligned to the first floating gate portion.

4. The non-volatile memory cell array of claim 3 wherein the second floating gate portion has a dimension along the direction of the string that is less than the minimum feature size of a lithographic process used to form the array.

5. The non-volatile memory cell array of claim 1 further comprising control gates forming a word line that extends in a second direction that is perpendicular to the first direction, an individual control gate extends over the second floating gate portion and extends over regions of the upper surface of the first floating gate portion that are not covered by the second floating gate portion.

6. A non-volatile memory cell array comprising:
conductive floating gates arranged in strings, each of the strings extends in a first direction, each string comprising at least four floating gates electrically connected in series by source/drain regions, the source/drain regions associated with a first of the strings electrically connect one floating gate to a next floating gate to form the first string, the source/drain regions of a given string are separated from the source/drain regions of adjacent strings by isolating elements, the floating gates individually comprise a first floating gate portion that has an upper surface and a lower surface, both upper and lower surfaces being parallel to a surface of a substrate, the floating gates individually comprise a second floating gate portion that extends upward from a first region of the upper surface of the first floating gate portion, each second floating gate portion extends from the upper surface of the first floating gate portion such that a cross-section of the floating gate that is parallel to the first direction forms an inverted T shape, the cell array has word lines that extend perpendicular to the first direction, each of the floating gates is separated from a portion of one of the word lines by a dielectric layer, the portions of the word lines form a plurality of control gates, the second floating gate portion is surrounded by a first control gate of the control gates, the first control gate extends over regions of the upper surface of the first floating gate portion that is not covered by the second floating gate portion.

7. The non-volatile memory cell array of claim 6 wherein the second floating gate portion has a dimension along the direction of the string that is less than the minimum feature size of a lithographic process used to form the array.

8. The non-volatile memory cell array of claim 6 wherein the second floating gate portion is self-aligned to the first floating gate portion.

9. The non-volatile memory cell array of claim 6 wherein a cross section of the second floating gate portion in the direction perpendicular to the string has a T-shape with wings that extend beyond the upper surface of the first floating gate portion.

* * * * *